United States Patent
Richter et al.

(10) Patent No.: US 7,375,495 B2
(45) Date of Patent: May 20, 2008

(54) METHOD FOR DETERMINATION OF THE CHARGE DRAWN BY AN ENERGY STORAGE BATTERY

(75) Inventors: Gerolf Richter, Hildesheim (DE); Ingo Koch, Hameln (DE)

(73) Assignee: VB Autobatterie GmbH, Hanover (DE)

(*) Notice: Subject to any disclaimer, the term of this patent is extended or adjusted under 35 U.S.C. 154(b) by 122 days.

(21) Appl. No.: 10/706,541

(22) Filed: Nov. 12, 2003

(65) Prior Publication Data
US 2004/0160215 A1 Aug. 19, 2004

(30) Foreign Application Priority Data
Nov. 14, 2002 (DE) ............... 102 53 051

(51) Int. Cl.
*H02J 7/00* (2006.01)

(52) U.S. Cl. .............. 320/125; 320/132; 324/427

(58) Field of Classification Search ........ 320/125, 320/130, 132, 133, 150, 155; 324/426, 427
See application file for complete search history.

(56) References Cited

U.S. PATENT DOCUMENTS

| | | |
|---|---|---|
| 3,906,329 A | 9/1975 | Bader |
| 4,153,867 A | 5/1979 | Jungfer et al. |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |
| 4,665,370 A | 5/1987 | Holland |
| 4,719,427 A | 1/1988 | Morishita et al. |
| 4,775,827 A * | 10/1988 | Ijntema et al. ........... 320/132 |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |

(Continued)

FOREIGN PATENT DOCUMENTS

DE 22 42 410 3/1973

(Continued)

OTHER PUBLICATIONS

Intelec ' 88—Tenth International communications Energy Conference, "A look at the Impedance of a Cell—S.L. DeBardelaben, New York Telephone Company," bearing a designation "Oct. 30-Nov. 2, 1988." (6 sheets).

(Continued)

*Primary Examiner*—Adolf Berhane
*Assistant Examiner*—Samuel Berhanu
(74) *Attorney, Agent, or Firm*—Foley & Lardner LLP

(57) ABSTRACT

A method for determining the charge drawn by an energy storage battery starting from an initial state of charge at the start of the drawing of the charge includes determining the charge drawn as a function of an exponential function with a time constant. The time constant is defined at least as a function of the energy storage battery type and of the temperature of at least one of the battery temperature and the electrolyte temperature. The method may be carried out utilizing a monitoring device or a computer program.

11 Claims, 4 Drawing Sheets

U.S. PATENT DOCUMENTS

| | | |
|---|---|---|
| 4,943,777 A | 7/1990 | Nakamura et al. |
| 4,952,861 A | 8/1990 | Horn |
| 5,002,840 A | 3/1991 | Klebenow et al. |
| 5,032,825 A | 7/1991 | Kuznicki |
| 5,055,656 A | 10/1991 | Farah et al. |
| 5,079,716 A | 1/1992 | Lenhardt et al. |
| 5,130,699 A | 7/1992 | Reher et al. |
| 5,159,272 A | 10/1992 | Rao et al. |
| 5,162,164 A | 11/1992 | Dougherty et al. |
| 5,204,610 A | 4/1993 | Pierson et al. |
| 5,223,351 A | 6/1993 | Wruck |
| 5,280,231 A | 1/1994 | Kato et al. |
| 5,281,919 A | 1/1994 | Palanisamy |
| 5,316,868 A | 5/1994 | Dougherty et al. |
| 5,321,627 A | 6/1994 | Reher |
| 5,352,968 A | 10/1994 | Reni et al. |
| 5,381,096 A * | 1/1995 | Hirzel ............... 324/427 |
| 5,404,129 A | 4/1995 | Novak et al. |
| 5,412,323 A | 5/1995 | Kato et al. |
| 5,416,402 A | 5/1995 | Reher et al. |
| 5,428,560 A | 6/1995 | Leon et al. |
| 5,439,577 A | 8/1995 | Weres et al. |
| 5,488,283 A | 1/1996 | Dougherty et al. |
| 5,549,984 A | 8/1996 | Dougherty |
| 5,552,642 A | 9/1996 | Dougherty et al. |
| 5,563,496 A | 10/1996 | McClure |
| 5,572,136 A | 11/1996 | Champlin |
| 5,578,915 A | 11/1996 | Crouch, Jr. et al. |
| 5,656,915 A | 8/1997 | Eaves |
| 5,680,050 A | 10/1997 | Kawai et al. |
| 5,698,965 A | 12/1997 | York |
| 5,721,688 A | 2/1998 | Bramwell |
| 5,744,936 A | 4/1998 | Kawakami |
| 5,744,963 A | 4/1998 | Arai et al. |
| 5,761,072 A | 6/1998 | Bardsley, Jr. et al. |
| 5,773,977 A | 6/1998 | Dougherty |
| 5,808,367 A | 9/1998 | Akagi et al. |
| 5,808,445 A | 9/1998 | Aylor et al. |
| 5,818,116 A | 10/1998 | Nakae et al. |
| 5,818,333 A | 10/1998 | Yaffe et al. |
| 5,896,023 A | 4/1999 | Richter |
| 5,898,292 A | 4/1999 | Takemoto et al. |
| 5,936,383 A | 8/1999 | Ng et al. |
| 5,949,217 A * | 9/1999 | Okada et al. ............... 320/132 |
| 5,965,954 A | 10/1999 | Johnson et al. |
| 5,977,654 A | 11/1999 | Johnson et al. |
| 5,990,660 A | 11/1999 | Meissner |
| 6,016,047 A | 1/2000 | Notten et al. |
| 6,037,749 A | 3/2000 | Parsonage |
| 6,037,777 A | 3/2000 | Champlin |
| 6,057,666 A | 5/2000 | Dougherty et al. |
| 6,087,808 A | 7/2000 | Pritchard |
| 6,091,325 A | 7/2000 | Zur et al. |
| 6,118,252 A | 9/2000 | Richter |
| 6,118,275 A | 9/2000 | Yoon et al. |
| 6,144,185 A | 11/2000 | Dougherty et al. |
| 6,160,382 A | 12/2000 | Yoon et al. |
| 6,222,341 B1 | 4/2001 | Dougherty et al. |
| 6,268,712 B1 | 7/2001 | Laig-Horstebrock et al. |
| 6,271,642 B1 | 8/2001 | Dougherty et al. |
| 6,296,593 B1 | 10/2001 | Gotou et al. |
| 6,300,763 B1 | 10/2001 | Kwok |
| 6,304,059 B1 | 10/2001 | Chalasani et al. |
| 6,331,762 B1 | 12/2001 | Bertness |
| 6,369,578 B1 | 4/2002 | Crouch, Jr. et al. |
| 6,388,421 B2 | 5/2002 | Abe |
| 6,388,450 B2 | 5/2002 | Richter et al. |
| 6,392,389 B1 | 5/2002 | Kohler |
| 6,392,414 B2 | 5/2002 | Bertness |
| 6,392,415 B2 | 5/2002 | Laig-Horstebrock et al. |
| 6,417,668 B1 | 7/2002 | Howard et al. |
| 6,424,157 B1 | 7/2002 | Gollomp et al. |
| 6,441,585 B1 | 8/2002 | Bertness |
| 6,445,158 B1 | 9/2002 | Bertness et al. |
| 6,452,361 B2 | 9/2002 | Dougherty et al. |
| 6,472,875 B1 | 10/2002 | Meyer |
| 6,495,990 B2 | 12/2002 | Champlin |
| 6,507,194 B2 | 1/2003 | Suzuki |
| 6,515,452 B2 | 2/2003 | Choo |
| 6,515,456 B1 | 2/2003 | Mixon |
| 6,522,148 B2 | 2/2003 | Ochiai et al. |
| 6,534,992 B2 | 3/2003 | Meissner et al. |
| 6,556,019 B2 | 4/2003 | Bertness |
| 6,600,237 B1 | 7/2003 | Meissner |
| 6,600,293 B2 | 7/2003 | Kikuchi |
| 6,608,482 B2 | 8/2003 | Sakai et al. |
| 6,653,818 B2 | 11/2003 | Laig-Horstebrock et al. |
| 2002/0008495 A1 | 1/2002 | Doughtery et al. |
| 2002/0026252 A1 | 2/2002 | Wruck et al. |
| 2002/0031700 A1 | 3/2002 | Wruck et al. |
| 2002/0101243 A1* | 8/2002 | Mentgen et al. ............ 324/427 |
| 2003/0047366 A1 | 3/2003 | Andrew et al. |
| 2003/0082440 A1 | 5/2003 | Mrotek et al. |
| 2003/0142228 A1 | 7/2003 | Flach et al. |
| 2003/0236656 A1 | 12/2003 | Dougherty |
| 2004/0021468 A1 | 2/2004 | Dougherty et al. |
| 2005/0089750 A1* | 4/2005 | Ng et al. .................... 429/120 |

FOREIGN PATENT DOCUMENTS

| | | |
|---|---|---|
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy-to-Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestersire, UK (11 sheets).

Battery Evaluation Reports, s.e. Ross Laboratories, Inc., Apr. 1999 (1 page).

HSR-003 Application Notes, Hermetic Switch, Inc., Highway 92, Post Office Box 2220, Chickasha, OK 73023, http://www.hermeticswitch.com/RS_frm.htm, available at least by Jan. 7, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pgs. http://www.cotorelay.com/ReedTech.pdf, available at least by Jan. 6, 2003, 37-43.

Willibert Schleuter, *Das elektrische Ersatzschaltbild des Blejakkumulators unter Berücksichtigung erzwungener Elektrolyströmung*, etz Archiv, vol. 4 (1982), Issue 7, pp. 213-218.

Lürkens et al., *Ladezustandsschätzuntt von Bleibatterien mit Hilfe des Kalman-Filters*, etz Archiv, vol. 8 (1986), Issue 7, pp. 231-236.

Brooke, L., "Resin Keeps Batteries Cool", A1 Inside Magazine, Nov. 1998, p. 55.

Hoover, J., "Failure Modes of Batteries Removed from Service", A Presentation at the 107th Convention of Battery Council International, Apr. 30-May 3, 1995, p. 62.

Stan Gibilisco and Neil Sclater, Co-Editors-in-Chief, "Rectifier Bridge," Encylcopedia of Electronics, 2nd Edition, TAB Professional and Reference Books, 1996, pp. 708-711.

Lehman, A., "Electrical Batter Model For Leo Application Based on Absolute Instantaneous State of Charge," Proceedings of the European Space Power Conference held in Madrid, Spain, Oct. 2-6, 1989, ESA Publications, NL, vol. 1, pp. 173-178.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Mayer, D. et al., "Modelling and Analysis of Lead Acid Battery Operation," Ecole des Mines de Paris, XP010092137, pp. 1-3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Bosch and the New E-Class, Electronic Battery Management System, Focus on Electronics, Nov. 2002 (1 sheet).

Forecast Review, The Battery Man, Nov. 1996 p. 21.

OnGuard™ XT Battery State-of-Health Monitor, 2003 Midtronics, Inc. P/N 156-983A (2 sheets).

* cited by examiner ic.org/10.1001/jama.2012.4108

METHOD FOR DETERMINATION OF THE CHARGE DRAWN BY AN ENERGY STORAGE BATTERY

CROSS-REFERENCE TO RELATED PATENT APPLICATIONS

Germany Priority Application DE 102 53 051.3, filed Nov. 14, 2002, including the specification, drawings, claims and abstract, is incorporated herein by reference in its entirety.

BACKGROUND

The present invention relates to a method for determining the charge drawn by an energy storage battery, and for monitoring devices and computer programs for carrying out such a method.

During operation of batteries (e.g., lead-acid energy storage batteries for use in vehicle starting, lighting, and ignition applications) it is advantageous to determine the instantaneous state of the energy storage battery and to predict a future state with assumed environmental and battery state conditions. In this case, it is also desirable to determine the charge which is drawn in the charging mode.

It is known for the to measure battery current continuously during the operating life of the energy storage battery for this purpose. The charge flowing into the energy storage battery and the charge drawn from the energy storage battery can be calculated from the converted current, and the state of charge can be determined by balancing these factors.

It is also known for the change in the state of charge by an energy storage battery to be determined by means of mathematical models, such as equivalent circuits.

One disadvantage of this method is that the battery current must be measured. Particularly for starter batteries with relatively high starter currents, this is highly complex.

It would be advantageous to provide an improved method for determination of the charge drawn by an energy storage battery, by means of which the amount of charge drawn by the energy storage battery during the charging mode can be determined as accurately as possible and with little measurement complexity, without measuring the battery current. It would also be advantageous to provide a monitoring device which has computation means for carrying out such a method. It would further be advantageous to provide a computer program to carry out the method described above. It would be advantageous to provide any one or more of these or other advantageous features.

SUMMARY

An exemplary embodiment relates to a method for determining the charge drawn by an energy storage battery starting from an initial state of charge at the start of the drawing of the charge. The method includes determining the charge drawn as a function of an exponential function with a time constant. The time constant is defined at least as a function of the energy storage battery type and of the temperature of at least one of the battery temperature and the electrolyte temperature.

Another exemplary embodiment relates to a monitoring device for energy storage batteries. The monitoring device includes a device for measuring battery temperature and a computation device for determining the charge drawn by an energy storage battery starting from an initial state of charge at the start of the drawing of the charge. The computation device is designed to carry out a method comprising determining the charge drawn as a function of an exponential function with a time constant, wherein the time constant is defined at least as a function of the energy storage battery type and of the temperature of at least one of the battery temperature and the electrolyte temperature.

Another exemplary embodiment relates to a computer program. The computer program includes computer program code designed to carry out a method when the computer program is run using a processor device. The method includes determining the charge drawn by an energy storage battery as a function of an exponential function with a time constant, wherein the time constant is defined at least as a function of the energy storage battery type and of the temperature of at least one of the battery temperature and the electrolyte temperature.

BRIEF DESCRIPTION OF THE DRAWINGS

The present invention will be explained in more detail in the following text with reference to the attached drawings, in which.

DETAILED DESCRIPTION OF THE PREFERRED AND EXEMPLARY EMBODIMENTS

Figure 1:
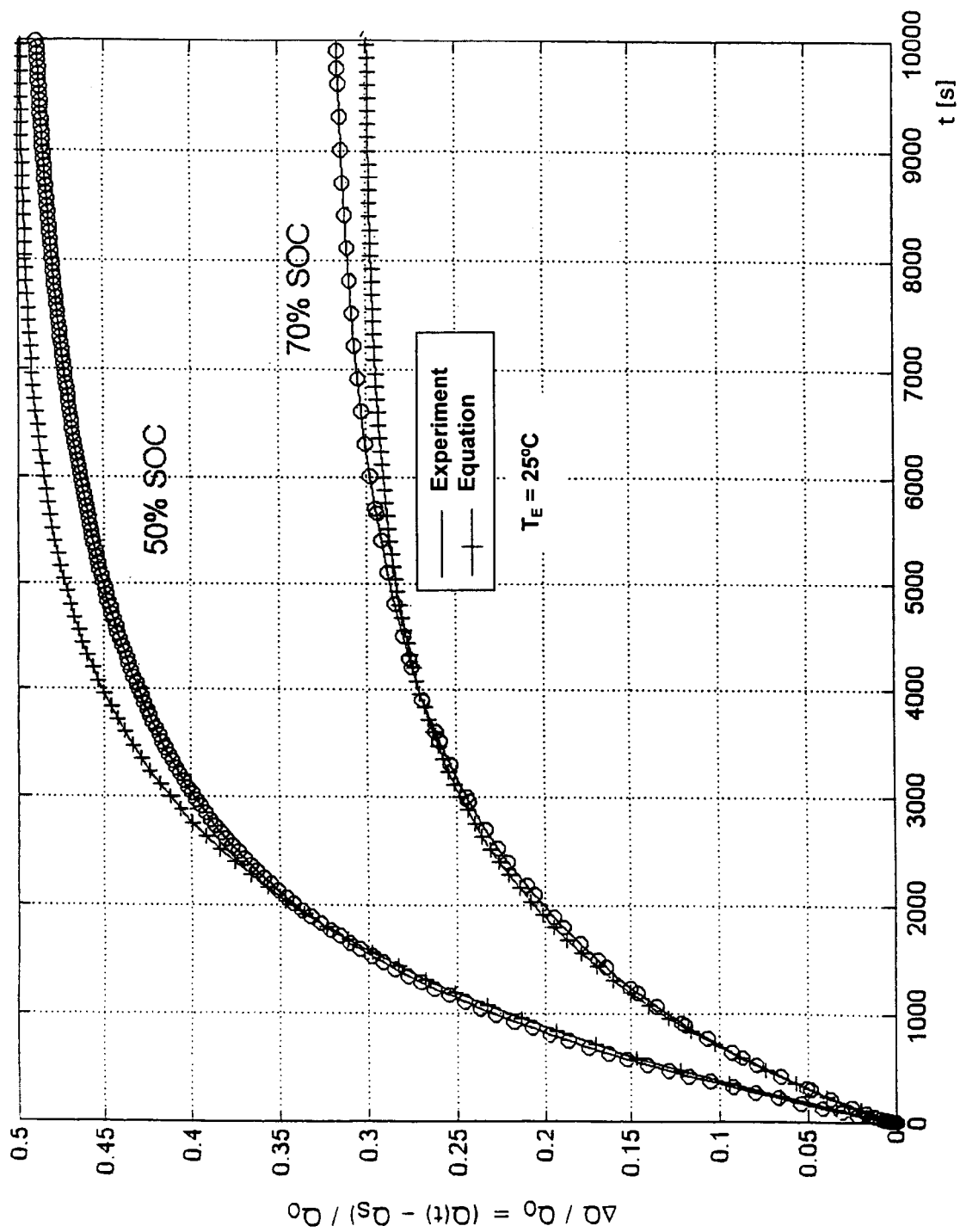
FIG. 1 shows a diagram or graph illustrating measured relative accumulated amounts of charge drawn as a function of the initial state of charge, determined using a method according to an exemplary embodiment.

An exemplary embodiment relates to a method for determination of the charge drawn by an energy storage battery starting from an initial state of charge at the start of the drawing of the charge.

According to an exemplary embodiment, the method includes determining the charge drawn as a function of an exponential function with a time constant. The time constant may be defined at least as a function of the energy storage battery type and of the battery or electrolyte temperature.

This is because experiments have shown that the charge which is drawn from an energy storage battery approaches a defined full state of charge, that is to say the rated capacity, exponentially and asymptotically. The rated capacity for energy storage batteries is already stated by the manufacturer. In this case, it has surprisingly been found that the time constant of the exponential function depends essentially on the energy storage battery type and on the battery or electrolyte temperature. The influence of the state of charge at the start of the drawing of the charge as well as of the mean charging voltage is, in contrast, very much less and need not necessarily be considered. All other influences are completely negligible.

The measurement complexity for determining the charge drawn is thus reduced to a measurement of the battery or electrolyte temperature, with the measured battery or electrolyte temperature being inserted into a function that is defined for the energy storage battery, in order to calculate the time constant. This function can be determined, for example, experimentally for each energy storage battery.

The time constant is preferably also defined as a function of the state of charge at the start of the drawing of the charge. It is particularly advantageous for the time constant also to be defined as a function of the charging voltage, of a mean charging voltage, or of a rated charging voltage.

The time constant can thus be determined by three factors that are multiplied by one another, with the first factor being determined using a function which is dependent on the energy storage battery type and on the charging voltage or on the mean charging voltage or on the rated charging voltage. The second factor is calculated using a function which is dependent on the state of charge at the start of the drawing of the charge. The third factor is calculated using a function which is dependent on the battery or electrolyte temperature.

The absolute amount of charge drawn by the energy storage battery may, for example, be calculated as a function $$\Delta Q \approx (1-e^{-T/\tau}) (Q_0 - Q_s)$$

with $Q_0$ being the rated capacity of the energy storage battery and $Q_s$ being the initial charge of the energy storage battery at the start of the drawing of the charge.

A relative state of charge, with respect to the rated capacity $Q_0$ of the energy storage battery, can also be calculated as a function $$Q(t)/Q_0 \approx 1-(1-Q_s/Q_0)e^{-t/\tau}.$$

The third factor as a function of the battery or electrolyte temperature may, for example, be a first correction factor $\tau_T$ for the time constant $\tau$, which is determined using the formula $$\tau_T = a^{-(T_e - T_{e,0})/b}$$

where $T_e$ is the electrolyte temperature of the energy storage battery, $T_{e,0}$ is a defined electrolyte nominal temperature, and a and b are constants. This first correction factor $\tau_T$ allows the influence of the electrolyte temperature on the charge that is drawn by the energy storage battery to be taken into account. This function is based on the Arrhenius Law, since the limiting physico-chemical reactions are dissolving reactions. For a time constant $\tau$ which has been normalized to room temperature of about 20° C., it has been found to be suitable in this to use a constant a with the value 2 with a tolerance of ±0.5, and a constant b with a value of 10 and a tolerance band of ±1.

The influence of the state of charge at the start of the drawing of the charge can be expressed by a second correction factor $\tau Q_s/Q_0$ for the time constant $\tau$, whose value range should be between 1 and $1-Q_s/Q_0$. The quotient $Q_s/Q_0$ is the initial charge $Q_s$ related to the rated capacity $Q_0$ at the start of the drawing of the charge.

FIG. 1 shows a diagram of the relative cumulated amounts of charge drawn $$\Delta Q(t)/Q_0 = \frac{Q(t) - Q_s}{Q_0}$$

for initial states of charge $Q_s/Q_0$ of 50% SOC and 70% SOC (SOC=state of charge). The charge that is drawn is plotted as a function of the time of the charging process, with this process being carried out with battery and electrolyte temperatures of 25° C.

In this case, the charge that was drawn was determined experimentally and, in comparison to this, was calculated using the method according to the exemplary embodiment. The experimentally determined amounts of charge drawn are represented by the curves denoted by circles. The amounts of charge drawn as determined using the method are represented by the curves denoted by lines crossing through.

As can be seen, the curves determined according to the exemplary embodiment and those determined experimentally for the relative cumulative amount of charge drawn match one another well.

At the time t=0 the energy storage battery has an initial charge $Q_s$ and an initial state of charge $Q_s/Q_0$ related to the rated capacity $Q_0$. The initial state of charge $Q_s/Q_0$ in the first case is 50% SOC and for the second case is 70% SOC. The remaining 50% or 30% charge, respectively, which can be absorbed as a minimum before reaching the full state of charge with the rated capacity $Q_0$, is drawn by the energy storage battery over a period of time in a charging process which takes place approximately exponentially.

The illustrated relative charge that is drawn $\Delta Q(t)/Q_0$ corresponds to the absolute charge that is drawn, related to the rated capacity $Q_0$, during the charging process.

The relative charge that is drawn is, according to the exemplary embodiment, determined proportionally to the formula:

$$\Delta Q/Q_0 \approx (1-e^{-T/\tau}) (1-Q_s/Q_0)$$

where t is the time and $\tau$ is a specific time constant. According to an exemplary embodiment, the time constant is a function of the energy storage battery type, of the battery or electrolyte temperature $T_e$, of the initial state of charge $Q_s/Q_0$ and of the charging voltage $U_L$. The charging voltage $U_L(t)$ over time, a mean charging voltage or a rated charging voltage $\overline{U}_{L,0}$, or the like, may be used as the charging voltage.

The time constant $\tau$ is a function of the battery or electrolyte temperature and of the energy storage battery type. The relationship between the optimum time constant $\tau$ and the exponential function, on the other hand, is only relatively slightly dependent on the initial state of charge $Q_s/Q_0$ at the start of the drawing of the charge, and on the charging voltage $U_L$. The charging voltage $U_L$ may already be available as a specific value for the energy storage battery type, if a function for determination of the time constant T is determined experimentally as a function of the energy storage battery type.

The battery or electrolyte temperature that is considered may also, for example, be determined as an instantaneous value measured at the start of the charging process, and may be kept constant for the subsequent charging process. The time constant $\tau$ may therefore have a constant value for one charging process. Alternatively, time constant $\tau$ may be adapted as a function of time during the charging process.

Figure 2:
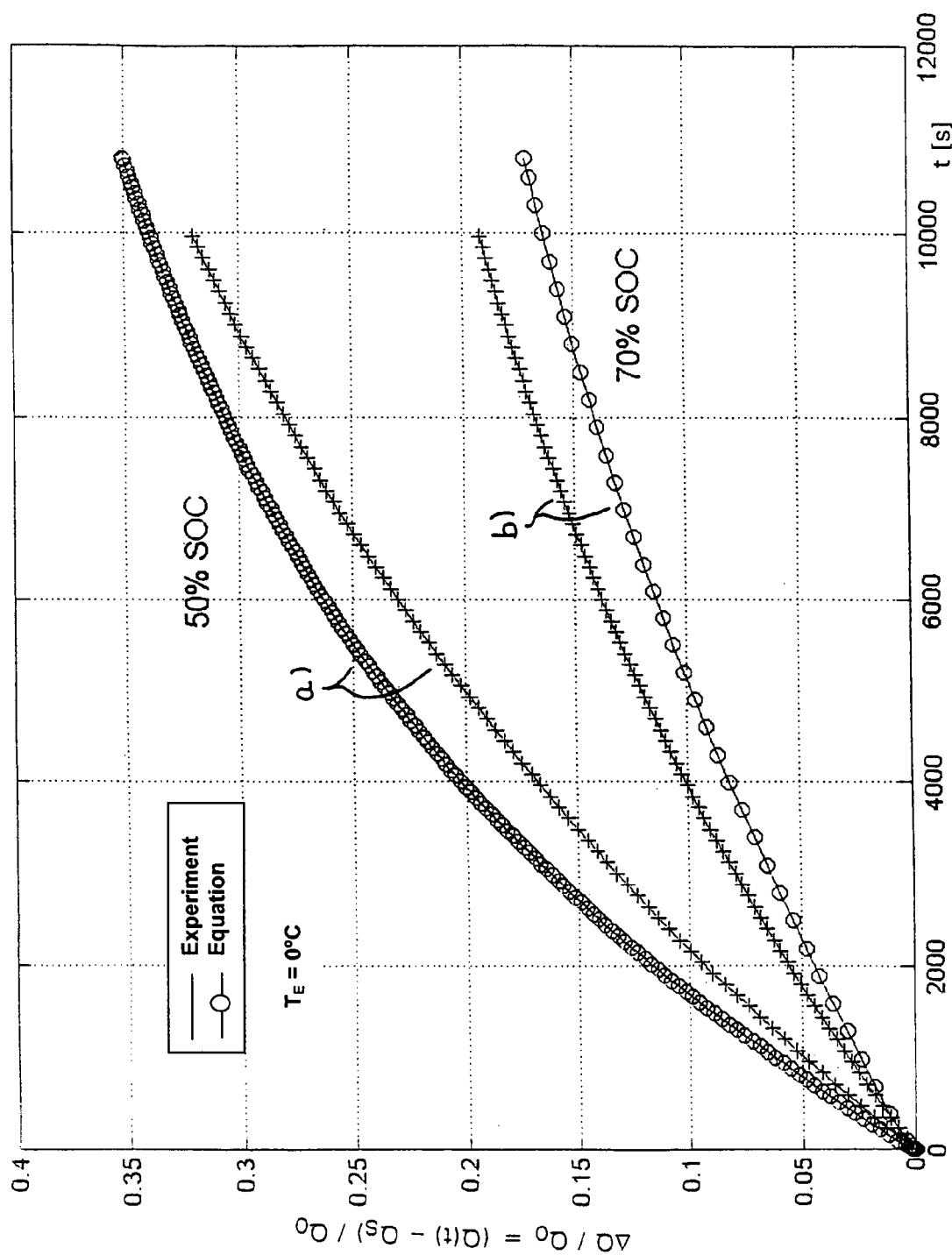
FIG. 2 shows a diagram or graph of measured relative accumulated amounts of charge drawn as a function of the initial state of charge, determined using a method according to an exemplary embodiment, with the time constant of the exponential function being corrected by a temperature-dependent correction factor.

FIG. 2 shows a diagram of the relative charge that is drawn $\Delta Q(t)/Q_0 = Q(t) - Q_s/Q_0$ at an electrolyte temperature of 0° C., and initial states of charge $Q_s/Q_0$ of 50% SOC and 70% SOC. Once again, the values for the relative charge drawn were determined experimentally and, in comparison to this, were determined by calculation using the method according to the exemplary embodiment. In the illustrated example, the time constant τ was corrected by means of a first correction factor $\tau_T$, which reflects the relationship between the time constant τ and the electrolyte temperature. Since the limiting physico-chemical reactions are dissolving reactions, a correction variable $$\tau_T = a^{-(T_e - T_{e,0})/b}$$

was defined on the basis of the Arrhenius Law, thus taking account of the influence of the electrolyte temperature on the charge drawn by the energy storage battery. In this case, $T_e$ is the electrolyte temperature, and $T_{e,0}$ is an electrolyte nominal temperature. The constants a and b are variables which are determined experimentally. The constant a should have a value of about 2 with a tolerance band of ±0.5, and the constant b should have a value of about 10 with a tolerance band of ±1.

As can be seen from FIG. 2, a time constant τ corrected in this way results in a relatively good match between the calculated relative cumulative charges drawn and the measured relative cumulative charges drawn. The result of the process of determining the charge drawn can be optimized even further by optimization of the constants a and b as a function of the energy storage battery type.

The dependency of the time constant τ on the relative state of charge $Q_s/Q_0$ at the start of the drawing of the charge is very small, since the internal resistance $R_i$ of the energy storage battery, which falls during the charging process, is compensated for in accordance with the product $\tau = R_i \times C$ by the rising capacity C of the energy storage battery. When calculating a time constant, the initial relative state of charge $Q_s/Q_0$ is preferably determined by means of a second correction factor $$\tau_{Q_s}/Q_0 = f(Q_s/Q_0)$$

in which case the second correction factor $\tau Q_s/Q_0$ should assume a value between 1 and $(1 - Q_s/Q_0)$.

The time constant τ can thus be determined using the relationship:

$$\tau \approx R_{i0}(\text{energy storage battery type, } U_L) \cdot \tau_{Q_s}/$$
$$Q_0 \cdot \tau_T = \tau_{RT0}(\text{energy storage battery type, } U_L) \cdot f$$
$$(Q_s/Q_u) \cdot f(T_e)$$

where $\tau_{RT0}$ is a time constant at room temperature, which is dependent only on the energy storage battery type and on the charging voltage $U_L$. This component $\tau_{RT0}$ of a time constant τ can be determined experimentally for energy storage batteries of one type and for vehicles from one manufacturer with respect to the normal charging voltage $U_L$, so that only a temperature measurement is required in order to determine the charge that is drawn.

Figure 3:
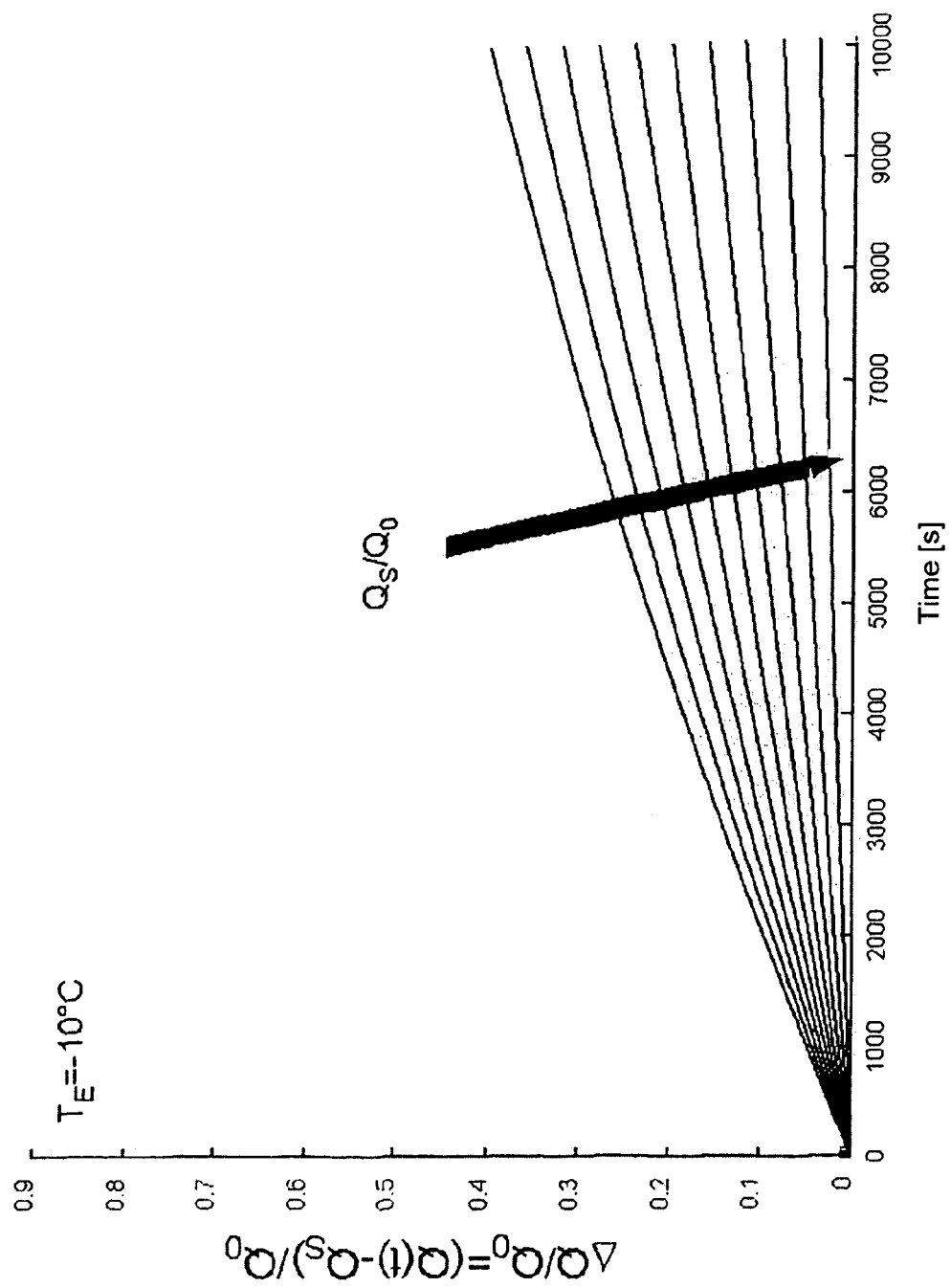
FIG. 3 shows a diagram or graph of the relative cumulative amounts of charge drawn for an electrolyte temperature of 25° C. as a function of the initial state of charge and of the time, using a constant charging voltage for a lead-acid motor vehicle battery.

FIG. 3 shows a diagram of the relative cumulative charge drawn $\Delta Q(t)/Q_0$ as a function of the initial relative state of charge $Q_s/Q_0$ at the start of the drawing of the charge, and the charging time t for a constant charging voltage of 14.2 V and an electrolyte temperature of 10° C., using the example of a lead-acid motor vehicle battery. This clearly shows that the charge drawn has an exponential profile. The exponential curves which are adjacent to one another for different initial states of charge have a high degree of linearity over a wide range of an initial relative state of charge $Q_s/Q_0$ from about 0% to 0.7%. This means that the influence of the initial relative state of charge on the curve profile is low.

Figure 4:
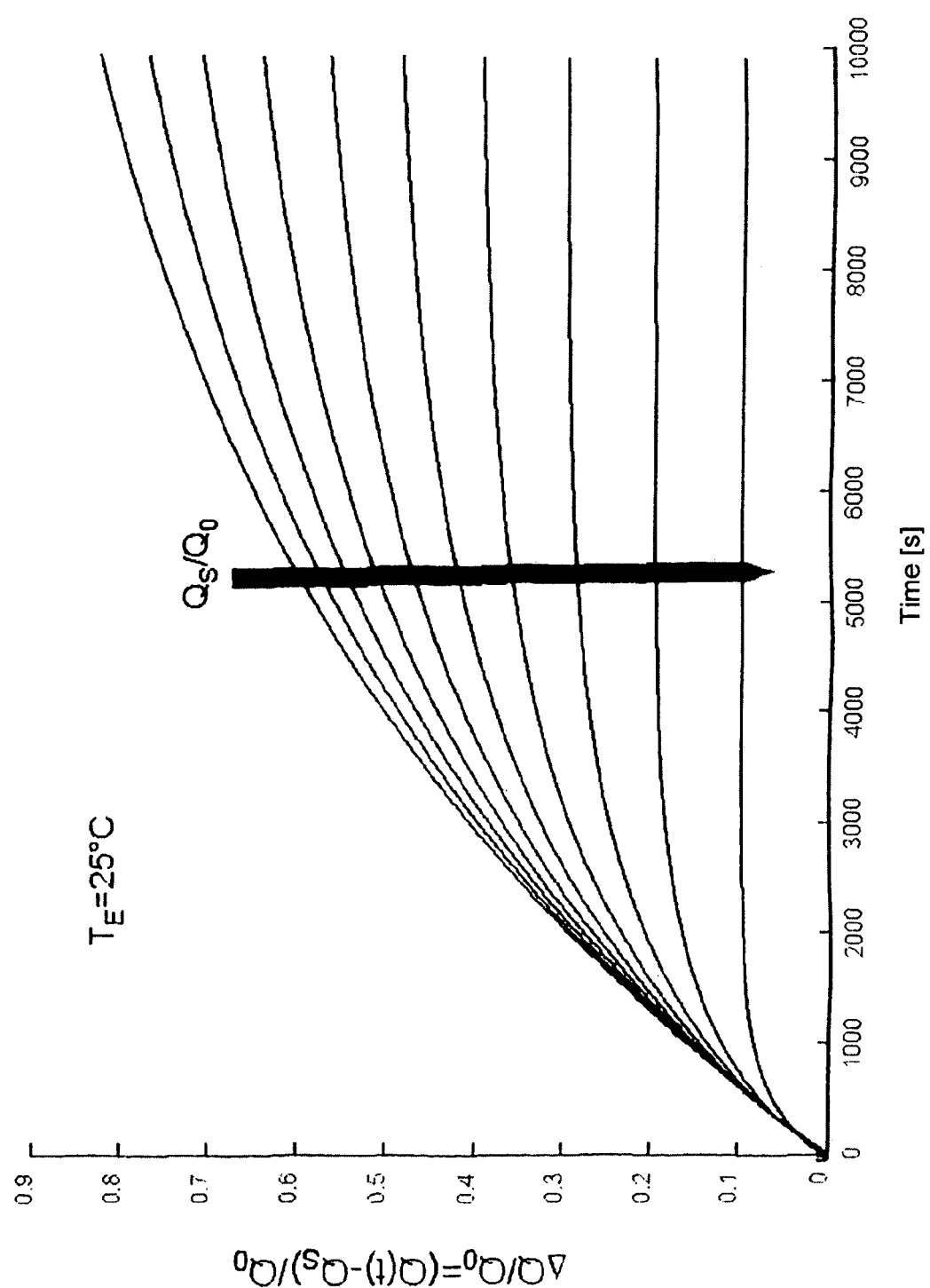
FIG. 4 shows a diagram or graph of the relative cumulative amounts of charge drawn for an electrolyte temperature of −10° C. as a function of the initial state of charge and of the charging time, with a constant charging voltage for a lead-acid motor vehicle battery.

FIG. 4 shows the relative cumulative charge drawn $\Delta Q(t)/Q_0$ as a function of the initial relative state of charge $Q_s/Q_0$ at the start of the drawing of the charge, and the time t for a constant charging voltage of 14.2 V and an electrolyte temperature of 25° C. In comparison to the curve profile in FIG. 3, this clearly shows that the profile of the charge drawn varies to a major extent when the electrolyte temperature $T_e$ changes. However, once again, the curve profile follows an exponential function.

According to an exemplary embodiment, a monitoring device for energy storage batteries is provided which includes a battery temperature measurement unit and a computation device or means for determining the charge drawn by the energy storage battery on the basis of the method mentioned above. The computation device may, for example, be in the form of a computer program which is run on a processor or processing device (e.g., a microprocessor), for example, a central vehicle computer in a motor vehicle.

According to another exemplary embodiment, a computer program is provided that includes program code for carrying out the method mentioned above. The program code is designed or configured to carry out the method when the computer program is run on a processor or processing device (e.g., a microprocessor), for example, a central vehicle computer in a motor vehicle. The computer program may be stored on a data storage medium (e.g., a disk drive, a CD, a floppy disk, etc.).

It is important to note that the preferred and other exemplary embodiments are illustrative only. Although only a few embodiments have been described in detail in this disclosure, those skilled in the art who review this disclosure will readily appreciate that many modifications are possible (e.g., variations in values of parameters, etc.) without materially departing from the novel teachings and advantages of the subject matter recited herein. Other substitutions, modifications, changes and omissions may be made in the design, operating conditions and arrangement of the preferred and other exemplary embodiments without departing from the scope of the present inventions.

What is claimed is:

1. A monitoring device for energy storage batteries comprising:
    a device for measuring battery temperature; and
    a computation device for determining the charge drawn by an energy storage battery starting from an initial state of charge at the start of the drawing of the charge;
    wherein the computation device is designed to carry out a method comprising:
    determining the charge drawn utilizing an exponential function from the start of the drawing of the charge, wherein the exponential function includes a time constant defined at least as a function of the energy storage battery type and of the temperature of the electrolyte measured by the device for measuring battery temperature.

2. The monitoring device of claim 1 wherein the time constant is also defined as a function of the state of charge at the start of the drawing of the charge.

3. The monitoring device of claim 1 wherein the method further comprises determining the absolute amount of charge drawn according to the function $$\Delta Q \approx (1 - e^{-t/\tau})(Q_0 - Q_s),$$

where ΔQ is the absolute amount of charge drawn, $Q_0$ is the defined rated capacity of the energy storage battery, and $Q_s$ is the initial charge of the energy storage battery at the start of the drawing of the charge.

4. The monitoring device of claim 1 wherein the method further comprises determining the relative state of charge of the energy storage battery with respect to the rated capacity of the energy storage battery according to the function:

$$Q(t)/Q_0 \approx 1-(1-Q_s/Q_0)^{-t/\tau}$$

where $Q(t)/Q_0$ is the relative state of charge of the energy storage battery, $Q_0$ is the rated capacity of the energy storage battery, and $Q_s$ is the initial charge of the energy storage battery at the start of the drawing of the charge.

5. The monitoring device of claim 1 wherein the method further comprises determining a first correction factor for the time constant, the first correction factor being determined using the formula:

$$\tau_T = a^{-(T_e - T_{e,0})/b}$$

where $\tau_T$ is the first correction factor, $T_e$ is the electrolyte temperature of the energy storage battery, $T_{e,0}$ is a defined electrolyte nominal temperature, and a and b are constants.

6. The monitoring device of claim 5 wherein the constant a has a value between 1.5 and 2.5 and the constant b has a value between 9 and 11.

7. The monitoring device of claim 4 wherein the method further comprises determining a second correction factor for the time constant, the second correction factor having a value between 1 and $1-Q_s/Q_0$.

8. The monitoring device of claim 1 further comprising a computer program comprising computer program code designed to carry out the method when the computer program is run using a processor device.

9. The monitoring device of claim 8 wherein the computer program is a program file stored on a data storage medium.

10. A computer program comprising:

computer program code designed to carry out a method when the computer program is run using a processor device, the method comprising:

determining the charge drawn by an energy storage battery utilizing an exponential function from the start of the drawing of the charge, wherein the exponential function includes a time constant defined at least as a function of the energy storage battery type and of the temperature of the electrolyte measured by a device for measuring battery temperature;

wherein the computer program is a program file stored on a data storage medium.

11. The program of claim 10 wherein the time constant is also defined as a function of at least one of a charging voltage, a mean charging voltage and a rated charging voltage.

* * * * *